(12) United States Patent
Lim et al.

(10) Patent No.: US 10,573,761 B2
(45) Date of Patent: Feb. 25, 2020

(54) PRESSURE SENSOR AND DISPLAY DEVICE HAVING THE SAME

(71) Applicants: Samsung Display Co., Ltd., Yongin-si (KR); UNIST(ULSAN NATIONAL INSTITUTE OF SCIENCE AND TECHNOLOGY), Ulsan (KR)

(72) Inventors: Jae Ik Lim, Yongin-si (KR); Won Sang Park, Yongin-si (KR); Hye Yong Chu, Yongin-si (KR); Jang-Ung Park, Ulsan (KR); Sung-Ho Shin, Ulsan (KR); Sangyoon Jin, Ulsan (KR); Seiho Choi, Ulsan (KR)

(73) Assignees: Samsung Display Co., Ltd., Yongin-si (KR); UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 41 days.

(21) Appl. No.: 15/852,906

(22) Filed: Dec. 22, 2017

(65) Prior Publication Data

US 2018/0182901 A1  Jun. 28, 2018

(30) Foreign Application Priority Data

Dec. 26, 2016 (KR) .................... 10-2016-0179482

(51) Int. Cl.
*H01L 29/84* (2006.01)
*H01L 29/51* (2006.01)
(Continued)

(52) U.S. Cl.
CPC .......... *H01L 29/84* (2013.01); *G02F 1/13338* (2013.01); *G06F 3/0412* (2013.01);
(Continued)

(58) Field of Classification Search
CPC ...... G06F 3/041; G06F 3/0412; G06F 3/0414; G02F 1/13338; H01L 29/84;
(Continued)

(56) References Cited

U.S. PATENT DOCUMENTS

2016/0259481 A1  9/2016  Lee
2017/0075475 A1*  3/2017  Miyake ................. G06F 3/0416
2017/0103714 A1*  4/2017  Yamamoto .......... G02F 1/13306

FOREIGN PATENT DOCUMENTS

KR    10-0857455    9/2008
KR    10-1135694    4/2012
(Continued)

OTHER PUBLICATIONS

Kaltenbrunner et al., An ultra-lightweight design for imperceptible plastic electronics, Nature, Jul. 25, 2013, vol. 499, pp. 458-465, Macmillan Publishers Limited.

*Primary Examiner* — Nathanael R Briggs
(74) *Attorney, Agent, or Firm* — H.C. Park & Associates, PLC

(57) ABSTRACT

A pressure sensor includes a semiconductor layer, a gate electrode, a gate insulating layer, and a source electrode, and may be incorporated as a switching transistor in a display device. The gate electrode is configured to overlap the semiconductor layer. The gate insulating layer is disposed between the semiconductor layer and the gate electrode and includes a first insulating layer disposed on a surface of the semiconductor layer that faces the gate electrode and a second insulating layer comprising an elastic material disposed at least between the first insulating layer and the gate electrode. The source electrode and a drain electrode respectively coupled to spaced portions of the semiconductor layer.

12 Claims, 7 Drawing Sheets

(51) Int. Cl.
- *G02F 1/1333* (2006.01)
- *H01L 29/49* (2006.01)
- *G06F 3/041* (2006.01)
- *H01L 27/32* (2006.01)
- *H01L 29/775* (2006.01)
- *H01L 29/66* (2006.01)
- *H01L 29/778* (2006.01)
- *H01L 29/16* (2006.01)
- *H01L 27/12* (2006.01)

(52) U.S. Cl.
CPC ........ *G06F 3/0414* (2013.01); *H01L 29/4908* (2013.01); *H01L 29/513* (2013.01); *H01L 29/517* (2013.01); *G06F 3/041* (2013.01); *G06F 2203/04105* (2013.01); *H01L 27/1251* (2013.01); *H01L 27/323* (2013.01); *H01L 29/1606* (2013.01); *H01L 29/66969* (2013.01); *H01L 29/775* (2013.01); *H01L 29/778* (2013.01)

(58) Field of Classification Search
CPC ... H01L 29/513; H01L 29/517; H01L 29/786; H01L 27/323; H01L 29/1606; H01L 29/66969; H01L 29/775; H01L 29/778
See application file for complete search history.

(56) References Cited

FOREIGN PATENT DOCUMENTS

| KR | 10-1453857 | 10/2014 |
|---|---|---|
| KR | 10-1552461 | 9/2015 |

\* cited by examiner

PRESSURE SENSOR AND DISPLAY DEVICE HAVING THE SAME

CROSS-REFERENCE TO RELATED APPLICATION

This application claims priority from and the benefit of Korean Patent Application No. 10-2016-0179482, filed on Dec. 26, 2016, which is hereby incorporated by reference for all purposes as if fully set forth herein.

BACKGROUND

Field

The invention relates generally to a pressure sensor and a display device including the same, and more particularly, to a pressure sensor and a display device including the same having improved sensitivity to pressure.

Discussion of the Background

With an increase in interest in information display and an increase in demand for portable information media, research on display devices and commercialization thereof have rapidly progressed.

Recently, as well as having an image display function, the display device may have a touch sensor for receiving a touch of a user. Consequently, the user may more easily use the display device by the touch sensor.

Recently, it also has been desired to provide various functions for the user, using not only the location of the touch but also a pressure generated by a touch.

The above information disclosed in this Background section is only for enhancement of understanding of the background of the inventive concepts, and, therefore, it may contain information that does not form the prior art that is already known in this country to a person of ordinary skill in the art.

SUMMARY

There is a need for the touch sensor in display device to sense both the location and the pressure of the touch with consistency and repeatability. Also, it may be desirable for a display device including a touch sensor not to increase its size due to the touch sensor. Pressure sensors and display devices constructed according to the principles of the invention are capable of improving sensitivity to pressure and being repeatedly used with the improved sensitivity.

Additional aspects will be set forth in the detailed description which follows, and, in part, will be apparent from the disclosure, or may be learned by practice of the inventive concept.

According to one aspect of the invention, a pressure sensor includes: a semiconductor layer; a gate electrode configured to overlap the semiconductor layer; a gate insulating layer disposed between the semiconductor layer and the gate electrode and including a first insulating layer disposed on a surface of the semiconductor layer that faces the gate electrode and a second insulating layer including an elastic material disposed at least between the first insulating layer and the gate electrode; and a source electrode and a drain electrode respectively coupled to spaced portions of the semiconductor layer.

The first insulating layer may include an aluminum oxide.
The second insulating layer may include silicone resin.

The second insulating layer may include at least one of polydimethylsiloxane and polysiloxane.

The semiconductor layer may include any one of oxide semiconductor material, organic semiconductor material, semiconductor material including carbon and a semiconductor nanowire.

The source electrode and the drain electrode may be disposed on a base substrate at positions spaced apart from each other, and the spaced portions of the semiconductor layer may be disposed on the source electrode and the drain electrode, respectively.

The second insulating layer may cover the first insulating layer, the source electrode, and the drain electrode.

According to another aspect of the invention, a display device includes: a first substrate including a pressure sensing cell and a first electrode coupled to the pressure sensing cell; a second substrate configured to face the first substrate and including a second electrode; and a liquid crystal layer disposed between the first substrate and the second substrate. The pressure sensing cell includes: a semiconductor layer disposed on a base substrate; a gate electrode configured to overlap the semiconductor layer; a gate insulating layer disposed between the semiconductor layer and the gate electrode and including a first insulating layer disposed on a surface of the semiconductor layer that faces the gate electrode and a second insulating layer including elastic material disposed at least between the first insulating layer and the gate electrode; and a source electrode and a drain electrode respectively coupled to spaced portions of the semiconductor layer.

The display device may further include a buffer layer disposed between the semiconductor layer and the base substrate.

According to still another aspect of the invention, a display device includes: a base substrate; a driving layer disposed on the base substrate and including a pressure sensing cell and a driving transistor coupled to the pressure sensing cell, wherein current in the driving transistor is controlled by the pressure sensing cell; and a display element including a first electrode coupled to the driving transistor, a light-emitting layer disposed on the first electrode, and a second electrode disposed on the light-emitting layer. The pressure sensing cell includes: a semiconductor layer disposed on the base substrate; a gate electrode configured to overlap the semiconductor layer; a gate insulating layer disposed between the semiconductor layer and the gate electrode and including a first insulating layer disposed on a surface of the semiconductor layer that faces the gate electrode and a second insulating layer including elastic material disposed at least between the first insulating layer and the gate electrode; and a source electrode and a drain electrode respectively coupled to spaced portions of the semiconductor layer.

According to the principles and exemplary embodiments of the invention, the first insulating layer protects the semiconductor layer from the material of the second insulating layer, which may be a permeable member having elasticity. Therefore, the first insulating layer may prevent or reduce deterioration of one or more of the electrical characteristics of the semiconductor layer caused by the second insulating layer, and the pressure sensor may be repeatedly used due to the second insulating layer. Accordingly, the pressure sensor may have improved sensitivity to the pressure and may be repeatedly used with improved sensitivity.

Furthermore, a display device having a pressure sensor constructed according to the principles of the invention may not only display an image, but also sense the magnitude of pressure applied by a touch and the location of the touch.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
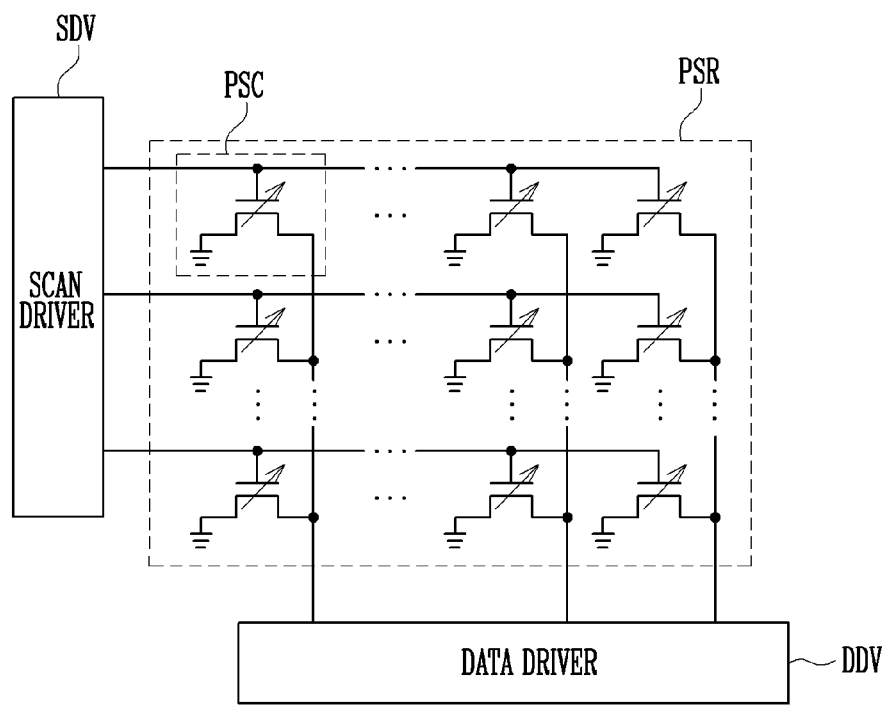
FIG. 1 is a block diagram illustrating an exemplary embodiment of a pressure sensor constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a block diagram illustrating an exemplary embodiment of a pressure sensor constructed according to the principles of the invention.

Referring to FIG. 1, the pressure sensor may include a sensing unit PSR which includes a plurality of pressure sensing cells PSC, a scan driver SDV which applies a scan signal to the pressure sensing cells PSC, and a data driver DDV which applies a data signal to the pressure sensing cells PSC.

The scan driver SDV may supply the scan signal to the pressure sensing cells PSC, in response to a scan control signal which is received from an external device. For example, the scan driver SDV may sequentially supply the scan signal to scan lines. When the scan signal is sequentially supplied to the scan lines, the pressure sensing cells PSC may be sequentially selected in a unit of the scan line.

The data driver DDV may supply the data signal to the pressure sensing cells PSC, in response to a data control signal which is received from the external device. For example, the data driver DDV may supply the data signal to data lines. The data signal supplied to the data lines may be supplied to the pressure sensing cells PSC selected by the scan signal.

The pressure sensing cells PSC may be coupled to the scan lines and the data lines. For example, the pressure sensing cells PSC arranged in a row direction may be coupled to each scan line, and the pressure sensing cells PSC arranged in a column direction may be coupled to each data line. When the scan signal is supplied to each scan line, the pressure sensing cells PSC coupled to a corresponding scan line may receive the data signal through the data lines.

Each of the pressure sensing cells PSC may be embodied in or implemented by a transistor. For instance, each of pressure sensing cells PSC may include a gate electrode, a source electrode and a drain electrode. The gate electrode may be coupled to the scan line, and either the source electrode or the drain electrode may be coupled to the data line.

The pressure sensing cell disposed at a region to which pressure is applied may change the current of the data signal that is applied through the corresponding data lines to the pressure sensing cell. The pressure sensor may further include a readout circuit which detects a change in the current of the data signal applied to the pressure sensing cells PSC. In this case, one of the source electrode and the drain electrode may be coupled to the data line, and the other one of the source electrode or the drain electrode may be grounded.

Alternatively, the pressure sensing cell disposed at a region to which pressure is applied may change the current output from the pressure sensing cell. The pressure sensor may further include a signal detector which detects a change in the current outputted from the pressure sensing cells PSC.

Consequently, the pressure sensor may measure a change in the current, and thus determine the magnitude of the pressure. Furthermore, the pressure sensor may determine, using the readout circuit or the signal detector, the location at which the pressure is applied.

Figure 2:
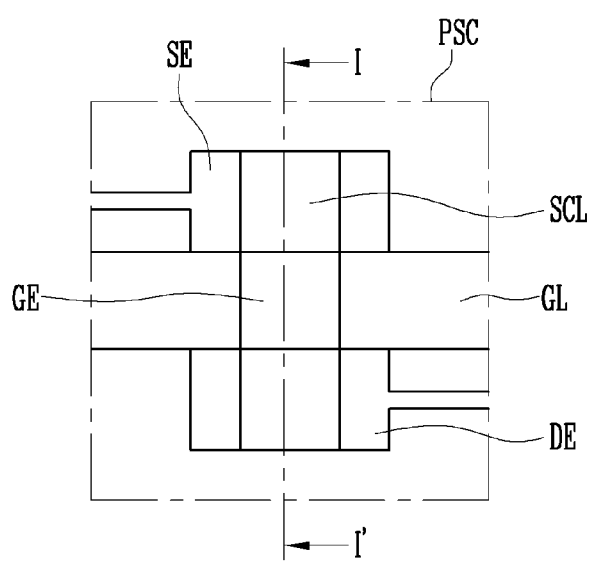
FIG. 2 is a plan view illustrating a pressure sensing cell shown in FIG. 1.
Figure 3:
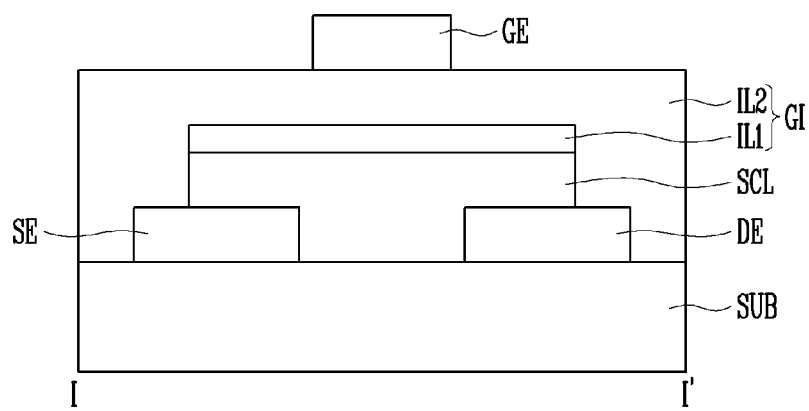
FIG. 3 is a cross-sectional view taken along line I-I' of FIG. 2.

FIG. 2 is a plan view illustrating the pressure sensing cell shown in FIG. 1. FIG. 3 is a cross-sectional view taken along line I-I' of FIG. 2.

Referring to FIGS. 1 to 3, the pressure sensor may include a plurality of pressure sensing cells PSC which are disposed on a base substrate SUB.

The base substrate SUB may be a rigid substrate. For example, the base substrate SUB may be one of a glass substrate, a quartz substrate, a glass ceramic substrate, and a crystalline glass substrate.

The base substrate SUB may be a flexible substrate. Here, the base substrate SUB may be either a film substrate or a plastic substrate which includes polymer organic material. For example, the base substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, materials forming the base substrate SUB may be changed. For instance, the base substrate SUB may include fiber reinforced plastic (FRP).

The base substrate SUB may allow light to pass therethrough, or may block light. For example, in the case where the base substrate SUB is used as a substrate of the display device, the base substrate SUB may include transparent insulating material which allows light to pass therethrough. Alternatively, when there is no need to allow light to pass through the base substrate SUB, the base substrate SUB may block light.

Each pressure sensing cell PSC may be a transistor. For example, the pressure sensing cell PSC may include a semiconductor layer SCL, a gate electrode GE which is insulated from the semiconductor layer SCL, a gate insulating layer GI which is disposed between the semiconductor layer SCL and the gate electrode GE, and a source electrode SE and a drain electrode DE which are coupled to the semiconductor layer SCL.

Hereinafter, the pressure sensing cell PSC will be described in more detail.

The source electrode SE and the drain electrode DE which are spaced apart form each other may be disposed on the base substrate SUB.

Each of the source electrode SE and the drain electrode DE may include low-resistance conductive material. For example, each of the source electrode SE and the drain electrode DE may include at least one of metals such as gold (Au), silver (Ag), aluminum (Al), molybdenum (Mo), chrome (Cr), titanium (Ti), nickel (Ni), neodymium (Nd), copper (Cu), and an alloy of the metals.

The semiconductor layer SCL may be disposed on the base substrate SUB, and coupled to the source electrode SE and the drain electrode DE. For instance, opposite ends of the semiconductor layer SCL may be respectively disposed on the source electrode SE and the drain electrode DE. A portion of the semiconductor layer SCL that is coupled to the source electrode SE may be a source area, and a portion of the semiconductor layer SCL that is coupled to the drain electrode DE may be a drain area. A portion of the semiconductor layer SCL that is formed between the source area and the drain area may be a channel area. At least the channel area in the semiconductor layer SCL may overlap the gate electrode GE.

The semiconductor layer SCL may include any one of oxide semiconductor material, organic semiconductor material, semiconductor material including carbon, and a semiconductor nanowire.

The oxide semiconductor material may include at least one of zinc (Zn), indium (In), gallium (Ga), tin (Sn), and a compound thereof. For example, the oxide semiconductor may include indium-gallium-zinc oxide (IGZO).

The organic semiconductor material may include pentacene.

The semiconductor material including carbon may include either carbon nanotube or graphene.

The semiconductor nanowire may include any one of a silicon (Si) nanowire, a germanium (Ge) nanowire, a GaAs nanowire, a GaP nanowire, an InP nanowire, a ZnS nanowire, and a ZnO nanowire.

The semiconductor layer SCL may be an n-type semiconductor or a p-type semiconductor depending on the kind of impurity contained therein. In the case where the semiconductor layer SCL is an n-type semiconductor containing an n-type impurity, any one of the source electrode SE and the drain electrode DE, e.g., the source electrode SE may receive a ground voltage, and the other, e.g., the drain electrode DE may receive a data signal through the data line. In the case where the semiconductor layer SCL is a p-type semiconductor containing a p-type impurity, any one of the source electrode SE and the drain electrode DE, e.g., the source electrode SE may receive the data signal, and the other, e.g., the drain electrode DE may receive a ground voltage.

The gate insulating layer GI may be disposed on the base substrate SUB on which the semiconductor layer SCL has been provided. The gate insulating layer GI may include a first insulating layer IL1, and a second insulating layer IL2 disposed on the first insulating layer ILL The first insulating layer IL1 may be disposed on the semiconductor layer SCL. For example, the first insulating layer IL1 may be disposed on a surface of the semiconductor layer SCL facing the gate electrode GE. The first insulating layer IL1 may include oxide or nitride having insulating properties. For example, the first insulating layer IL1 may include aluminum oxide (AlOx). The first insulating layer IL1 may prevent material included in the second insulating layer IL2 from diffusing or permeating into the semiconductor layer SCL.

The second insulating layer IL2 may cover the first insulating layer IL1, the source electrode SE and the drain electrode DE. The second insulating layer IL2 may include silicone resin. For example, the second insulating layer IL2 may include at least one of polydimethylsiloxane and polysiloxane. The silicone resin may have elasticity. Therefore, even when the second insulating layer IL2 is deformed by pressure, the second insulating layer IL2 may be restored to its original form if the pressure is removed.

The gate electrode GE may be disposed on the gate insulating layer GI, in particular, the second insulating layer IL2. The gate electrode GE may be insulated from the semiconductor layer SCL, and overlap at least the channel area of the semiconductor layer SCL. The gate electrode GE may be coupled to the scan line through a gate line GL and may receive a scan signal applied to the scan line. The gate electrode GE may include at least one of gold (Au), silver (Ag), aluminum (Al), molybdenum (Mo), chrome (Cr), titanium (Ti), nickel (Ni), neodymium (Nd), copper (Cu), and an alloy of them.

While the gate electrode GE of the pressure sensing cell PSC in the illustrated embodiment is shown as disposed above the semiconductor layer SCL, the exemplary embodiments are not limited thereto. For example, the gate electrode GE of the pressure sensing cell PSC may be disposed below the semiconductor layer SCL. The position of the gate electrode GE relative to the semiconductor layer SCL may be variously changed as long as the pressure sensing cell PCS still forms a transistor.

As described above, in the pressure sensor having the pressure sensing cells PSC, the second insulating layer IL2 includes elastic material. Thus, even when the second insulating layer IL2 is deformed by pressure, the second insulating layer IL2 may be restored to its original form if the pressure is removed. Therefore, the pressure sensing cells PSC may repeatedly measure pressure.

FIGS. 4 to 7 are cross-sectional views illustrating an exemplary method of manufacturing the pressure sensor according to the principles of the invention.

Figure 4:
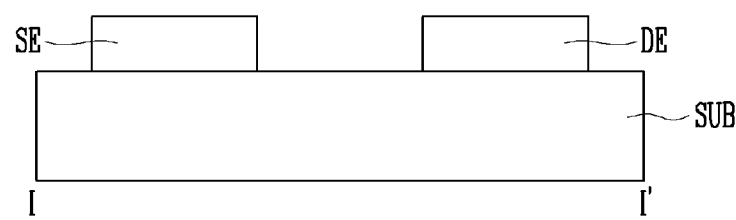
FIGS. 4 to 7 are cross-sectional views illustrating an exemplary method of manufacturing the pressure sensor according to the principles of the invention.

Referring to FIG. 4, the source electrode SE and the drain electrode DE are formed on the base substrate SUB.

The base substrate SUB may be a rigid substrate or a flexible substrate. The base substrate SUB may allow light to pass therethrough, or may block light.

The source electrode SE and the drain electrode DE may be formed at positions spaced apart from each other. The source electrode SE and the drain electrode DE may be formed by forming a conductive layer containing conductive material on the base substrate SUB and then patterning the conductive layer.

Each of the source electrode SE and the drain electrode DE may include low-resistance conductive material. For example, each of the source electrode SE and the drain electrode DE may include at least one of metals such as gold (Au), silver (Ag), aluminum (Al), molybdenum (Mo), chrome (Cr), titanium (Ti), nickel (Ni), neodymium (Nd), copper (Cu), and an alloy of the metals.

Either the source electrode SE or the drain electrode DE may be coupled to a data line. The data line may be disposed on the same layer as that of the source electrode SE and the drain electrode DE and made of the same material as that of the source electrode SE and the drain electrode DE. However, the exemplary embodiments are not limited thereto. As needed, the data line may be disposed on a layer different from that of the source electrode SE and the drain electrode DE and made of material different from that of the source electrode SE and the drain electrode DE.

Figure 5:
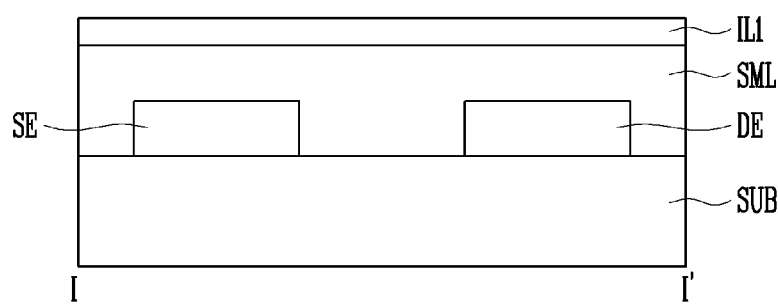

Referring to FIG. 5, after forming the source electrode SE and the drain electrode DE, a semiconductor material layer SML is formed on the base substrate SUB on which the source electrode SE and the drain electrode DE are disposed.

The semiconductor material layer SML may include any one of oxide semiconductor material, organic semiconductor material, semiconductor material including carbon, and a semiconductor nanowire.

After forming the semiconductor material layer SML, a first insulating layer IL1 is formed on the semiconductor material layer SML. The first insulating layer IL1 may function to protect the semiconductor material layer SML, and include oxide and/or nitride. For example, the first insulating layer IL1 may include aluminum oxide (AlOx).

Figure 6:
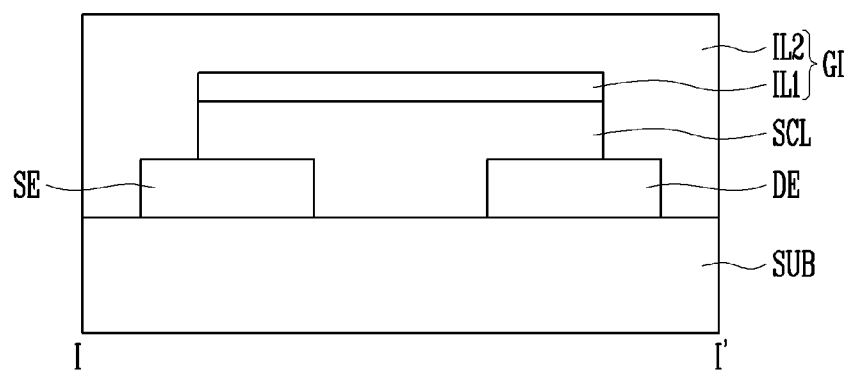

Referring to FIG. 6, after forming the first insulating layer IL1, the semiconductor material layer SML and the first insulating layer IL1 are patterned. The semiconductor material layer SML may be formed, by the patterning process, into a semiconductor layer SCL which is coupled to the source electrode SE and the drain electrode DE. Furthermore, the first insulating layer IL1 may be disposed only on the semiconductor layer SCL by the patterning process.

The semiconductor material layer SML and the first insulating layer IL1 may be simultaneously patterned or successively patterned. For example, when the semiconductor material layer SML includes oxide semiconductor material, the semiconductor material layer SML and the first insulating layer IL1 may be simultaneously patterned by a dry etching process. Alternatively, when the semiconductor material layer SML includes organic semiconductor material, the first insulating layer IL1 may be patterned before the semiconductor material layer SML is patterned. In this case, the first insulating layer IL1 may be patterned through a dry etching process, and the semiconductor material layer SML may be patterned through a wet etching process. However, exemplary embodiments are not limited thereto. For example, the first insulating layer IL1 may be patterned through the wet etching process.

A portion of the semiconductor layer SCL that is coupled to the source electrode SE may be a source area, and a portion of the semiconductor layer SCL that is coupled to the drain electrode DE may be a drain area. A portion of the semiconductor layer SCL that is disposed between the source area and the drain area may be a channel area.

After patterning the semiconductor material layer SML and the first insulating layer IL1, a second insulating layer IL2 is formed on the base substrate SUB on which the semiconductor layer SCL and the first insulating layer IL1 are formed.

The second insulating layer IL2 may include silicone resin. For example, the second insulating layer IL2 may include at least one of polydimethylsiloxane and polysiloxane. The silicone resin may have elasticity. Therefore, even when the second insulating layer IL2 is deformed by pressure, the second insulating layer IL2 may be restored to its original form if the pressure is removed.

Figure 7:
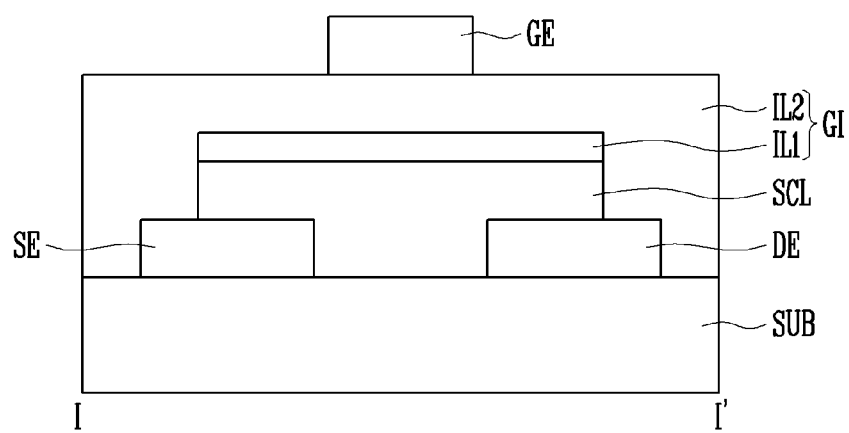

Referring to FIG. 7, after forming the second insulating layer IL2, a gate electrode GE is formed on the second insulating layer IL2. The gate electrode GE may be insulated from the semiconductor layer SCL by the first insulating layer IL1 and the second insulating layer IL2. As described above, a gate insulating layer GI which insulates the gate electrode GE from the semiconductor layer SCL may include the first insulating layer IL1 and the second insulating layer IL2.

The gate electrode GE may overlap at least the channel area of the semiconductor layer SCL. The gate electrode GE may include at least one of gold (Au), silver (Ag), aluminum (Al), molybdenum (Mo), chrome (Cr), titanium (Ti), nickel (Ni), neodymium (Nd), copper (Cu), and an alloy of them.

The gate electrode GE may be coupled to a scan line. The scan line and the gate electrode GE may be disposed on the same layer and made of the same material. However, exemplary embodiments are not limited thereto. As needed, the scan line and the gate electrode GE may be disposed on different layers and made of different materials.

Figure 8:
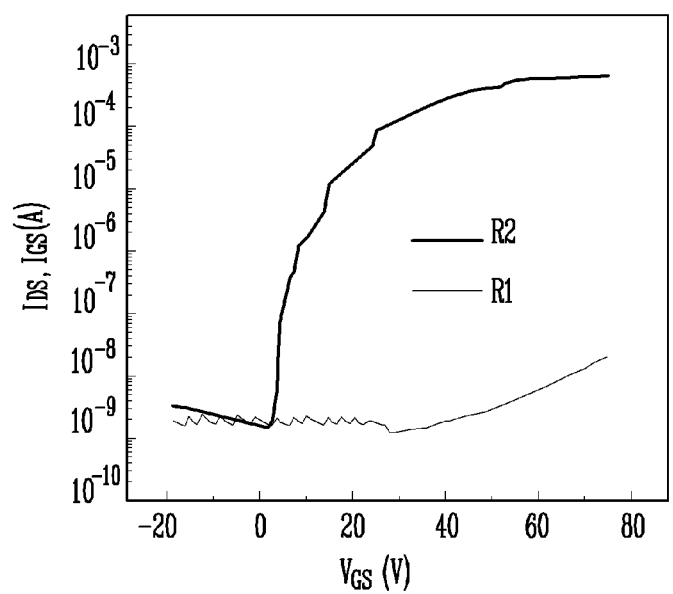
FIG. 8 is a graph illustrating current-voltage characteristics of pressure sensing cells having different types of gate insulating layers.

FIG. 8 is a graph illustrating current-voltage characteristics of pressure sensing cells having different types of gate insulating layers. In FIG. 8, the x-axis denotes the gate-source voltage $V_{GS}$ of a pressure sensing cell and the y-axis denotes the drain-source current $I_{DS}$ or gate-source current $I_{GS}$ of a pressure sensing cell. R1 denotes current-voltage characteristics of a pressure sensing cell that includes a semiconductor layer containing indium-gallium-zinc oxide (IGZO) and a gate insulating layer containing polydimethylsiloxane. R2 denotes current-voltage characteristics of a pressure sensing cell that includes a semiconductor layer containing IGZO, and a gate insulating layer provided on the semiconductor layer, the gate insulating layer including a first insulating layer which contains aluminum oxide ($Al_2O_3$), and a second insulating layer which is provided on the first insulating layer and contains polydimethylsiloxane.

Referring to FIG. 8, a pressure sensor including the semiconductor layer which contains oxide semiconductor material such as IGZO may have different characteristics, depending on whether the first insulating layer is present or not.

For example, as shown by R1, it may be understood that, when the first insulating layer containing $Al_2O_3$ is not present on the semiconductor layer, variation in the current in the pressure sensing cell depending on variation in gate voltage is very low. The reason for this is because of the fact that, if the first insulating layer containing $Al_2O_3$ is not present, substances included in the gate insulating layer containing the polydimethysiloxane may diffuse or permeate into the semiconductor layer. If the substances, i.e., impurities, diffuse or permeate into the semiconductor layer, the impurities may remain in the channel area of the semiconductor layer. In the channel area, the impurities may impede the flow of current.

However, as shown by R2, it may be understood that, when a gate insulating layer includes the first insulating layer which is disposed on the semiconductor layer and contains $Al_2O_3$, and the second insulating layer which is disposed on the first insulating layer and contains polydimethysiloxane, the pressure sensing cell may be normally operated. For example, the current of the pressure sensing cell may increase as the increase of the voltage applied to the pressure sensing cell when the voltage is higher than its threshold voltage, as shown by R2. The reason for this is because the first insulating layer prevents or reduces the ability of substances included in the second insulating layer from diffusing or permeating into the semiconductor layer.

Figure 9:
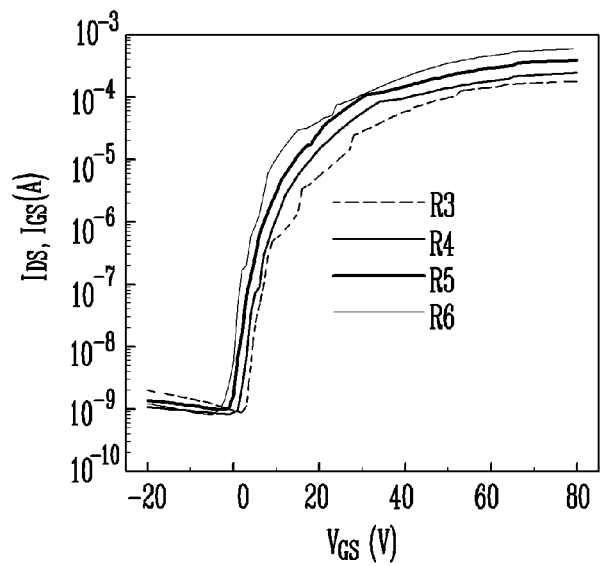
FIG. 9 is a graph illustrating current-voltage characteristics of a pressure sensing cell when applying different pressures.
Figure 10:
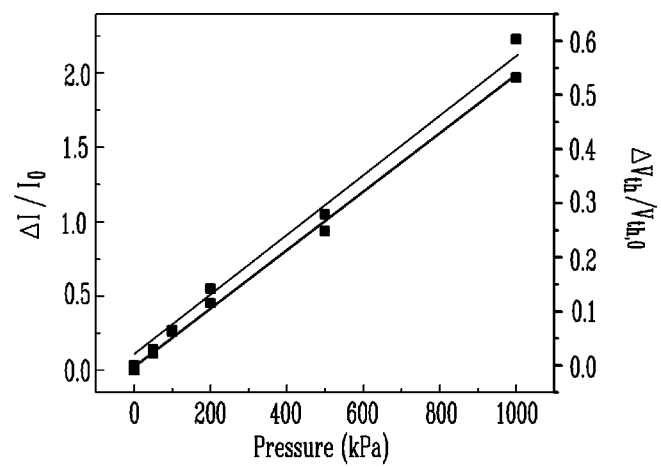
FIG. 10 is a graph illustrating variations in current and threshold voltage of a pressure sensing cell depending on a pressure.

FIG. 9 is a graph illustrating current-voltage characteristics of a pressure sensing cell when applying different pressures. FIG. 10 is a graph illustrating variations in current and threshold voltage of a pressure sensing cell depending on a pressure. In FIG. 9, the x-axis denotes a gate-source voltage $V_{GS}$ of the pressure sensing cell and the y-axis denotes drain-source current $I_{DS}$ or gate-source current $I_{GS}$ of the pressure sensing cell. R3 to R6 show current-voltage characteristics of the pressure sensing cell in which the gate insulating layer includes the first insulating layer which is disposed on the semiconductor layer and contains $Al_2O_3$, and the second insulating layer which is disposed on the first insulating layer and contains polydimethylsiloxane. R3 denotes current-voltage characteristics of the pressure sensing cell when no pressure is applied thereto. R4 denotes current-voltage characteristics of the pressure sensing cell when a pressure of 100 Kpa is applied thereto. R5 denotes current-voltage characteristics of the pressure sensing cell when a pressure of 500 Kpa is applied thereto. R6 denotes current-voltage characteristics of the pressure sensing cell when a pressure of 1000 Kpa is applied thereto.

Referring to FIGS. 9 and 10, as the pressure applied to the pressure sensing cell increases, the threshold voltage of the pressure sensing cell is reduced. The reason for this is because the thickness of the second insulating layer of the gate insulating layer is reduced by the pressure. Under the same gate voltage conditions, the magnitude of an electric field applied to the semiconductor layer when the thickness of the gate insulating layer is small may be greater than the magnitude of an electric field applied to the semiconductor layer when the thickness of the gate insulating layer is large. In other words, as the pressure increases, the threshold voltage of the pressure sensing cell may be reduced.

Since the threshold voltage of the pressure sensing cell is reduced with an increase in pressure, current of the drain electrode may increase under the same voltage of the drain electrode when the pressure increases. Therefore, when voltage to be applied to the gate electrode and voltage to be applied to the drain electrode are fixed, the magnitude of the pressure may be sensed by measuring variation in current of the drain electrode of the pressure sensing cell depending on the pressure.

FIG. 10 illustrates variations in the drain current ΔI and the threshold voltage ΔVth of the pressure sensing cell depending on the pressure. As shown in FIG. 10, the drain current ΔI and the threshold voltage ΔVth are linearly changed. In FIG. 10, $I_0$ and Vth,0 mean the drain current and the threshold voltage, respectively, in the case where the pressure is 0.

FIGS. 11 to 14 are sectional views illustrating exemplary embodiments of a display device having a pressure sensing cell constructed according to the principles of the invention.

Hereinafter, for descriptive convenience, depending on types of a display device, exemplary embodiments of a display device in FIGS. 11 and 12 will be described together, and exemplary embodiments of a display device in FIGS. 13 and 14 will be thereafter described together.

Figure 11:
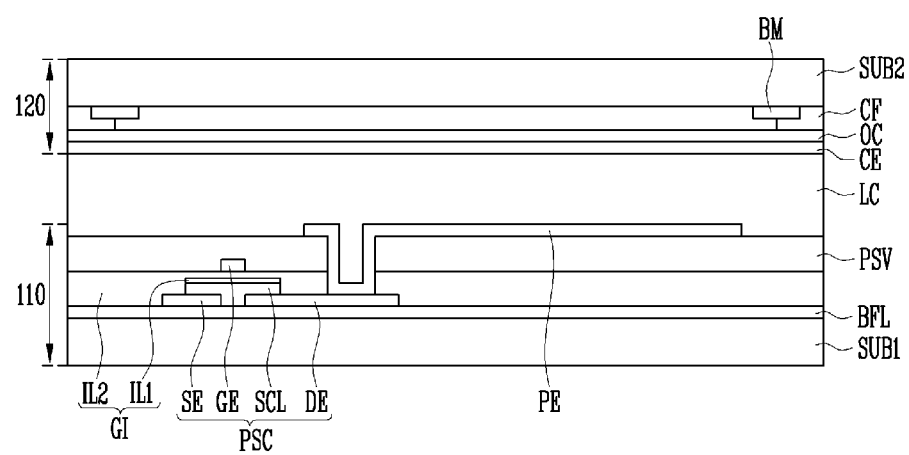
FIGS. 11 to 14 are sectional views illustrating exemplary embodiments of a display device having a pressure sensing cell constructed according to the principles of the invention.
Figure 12:
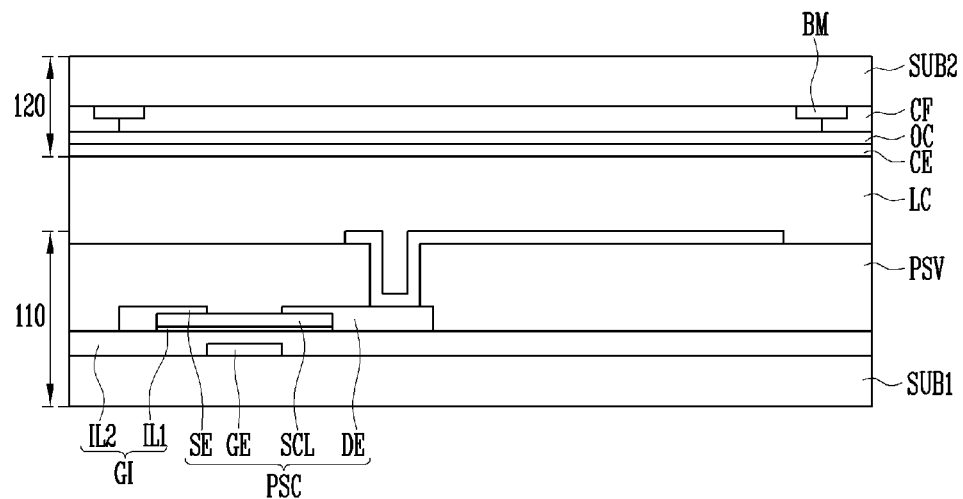

Referring to FIGS. 11 and 12, a display device may be a non self-emissive display device. For example, the display device may be any one of a liquid crystal display (LCD), an electrophoretic display (EPD), and an electrowetting display (EWD). In the following description, for descriptive convenience, the LCD will be described as an example of the display device.

The display device may include a first substrate 110, a second substrate 120 which faces the first substrate 110, and a liquid crystal layer LC which is disposed between the first substrate 110 and the second substrate 120 and includes a plurality of liquid crystal molecules.

The first substrate 110 may include a first base substrate SUB1, at least one pressure sensing cell PSC which is disposed on the first base substrate SUB1, a protective layer PSV which covers the pressure sensing cell PSC, and a first electrode PE which is coupled to the pressure sensing cell PSC.

The first base substrate SUB1 may include transparent insulating material and allow light to pass therethrough. The first base substrate SUB1 may be a rigid substrate. Alternatively, the first base substrate SUB1 may be a flexible substrate.

The pressure sensing cell PSC may be a switching transistor of the display device. In detail, the pressure sensing cell PSC may turn on or off an image signal to be applied to the first electrode PE.

The pressure sensing cell PSC may be disposed on the first base substrate SUB1. The pressure sensing cell PSC may include a gate electrode GE, a semiconductor layer SCL, a source electrode SE, a drain electrode DE, and a gate insulating layer GI which is disposed between the gate electrode GE and the semiconductor layer SCL. The gate insulating layer GI may insulate the semiconductor layer SCL from the gate electrode GE. The semiconductor layer SCL may be disposed on the first base substrate SUB1, and include any one of oxide semiconductor material, organic semiconductor material, semiconductor material including carbon, and a semiconductor nanowire. The source electrode SE and the drain electrode DE may be disposed at positions spaced apart from each other, and be coupled to the semiconductor layer SCL.

The pressure sensing cell PSC may be implemented in various ways and types. For example, as shown in FIG. 11, the pressure sensing cell PSC may be one in which the gate electrode GE is disposed over the semiconductor layer SCL.

The gate insulating layer GI may include a first insulating layer IL1 disposed on the semiconductor layer SCL, and a second insulating layer IL2 disposed on the first insulating layer IL1 and the first base substrate SUB1. The first insulating layer IL1 may include oxide or nitride having insulating properties. For example, the first insulating layer IL1 may include aluminum oxide (AlOx). The second insulating layer IL2 may include silicone resin. For example, the second insulating layer IL2 may include at least one of polydimethylsiloxane and polysiloxane.

Furthermore, a buffer layer BFL may be disposed between the pressure sensing cell PSC and the first base substrate SUB1. The buffer layer BFL may prevent impurities included in the first base substrate SUB1 from diffusing and permeating into the semiconductor layer SCL, whereby electrical characteristics of the pressure sensing cell PSC may be prevented from being deteriorated.

As shown in FIG. 12, the pressure sensing cell PSC may be one in which the gate electrode GE is disposed below the semiconductor layer SCL. The gate insulating layer GI may include the second insulating layer IL2 disposed on the gate electrode GE, and the first insulating layer IL1 disposed on the second insulating layer IL2.

The protective layer PSV may cover the pressure sensing cell PSC and expose a portion of the drain electrode DE. The protective layer PSV may include at least one layer. For example, the protective layer PSV may include at least one of an inorganic protective layer and an organic protective layer. For example, the protective layer PSV may include an inorganic protective layer which covers the pressure sensing cell PSC, and an organic protective layer disposed on the inorganic protective layer.

The inorganic protective layer may include at least one of silicon oxide (SiOx) and silicon nitride (SiNx). For instance, the inorganic protective layer may include a first layer which covers the pressure sensing cell PSC and contains silicon oxide, and a second layer which is disposed on the first layer and contains silicon nitride.

The organic protective layer may include organic insulating material allowing light to pass therethrough. For example, the organic protective layer may include at least one of polyacrylates resin, epoxy resin, phenolic resin, polyamides resin, polyimides resin, unsaturated polyesters resin, poly-phenylen ethers resin, poly-phenylene sulfides resin, and benzocyclobutene resin.

The first electrode PE may be disposed on the protective layer PSV, and coupled to the drain electrode DE. The first electrode PE may include transparent conductive oxide. For example, the first electrode PE may include at least one of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The second substrate 120 may face the first substrate 110. The second substrate 120 may include a second base substrate SUB2, a light blocking pattern BM, a color filter CF, an overcoating layer OC and a second electrode CE.

The second base substrate SUB2 may include the same material as that of the first base substrate SUB1. In other words, the second base substrate SUB2 may be a rigid substrate or a flexible substrate.

The light blocking pattern BM may be disposed on one surface of the second base substrate SUB2, e.g., a surface facing the first substrate 110. The light blocking pattern BM may prevent light from leaking out due to misarrangement of the liquid crystal molecules.

The color filter CF may be disposed on the second base substrate SUB2 exposed by the light blocking pattern BM. The color filter CF may have any one color of red, green, blue, cyan, magenta and yellow. While the color filter CF in the illustrated embodiments is shown as included in the second substrate 120, exemplary embodiments are not limited thereto. For example, the color filter CF may be included in the first substrate 110.

The overcoating layer OC may cover the color filter CF, and reduce stepped portions, for example, caused by the light blocking pattern BM and the color filter CF.

The second electrode CE may be disposed on the overcoating layer OC. The second electrode CE may be insulated from the first electrode PE, and include the same material as that of the first electrode PE. Furthermore, the second electrode CE may receive a common voltage (Vcom) provided from the external device. The second electrode CE may be disposed on one surface of the second substrate 120 that faces the first substrate 110.

While the second electrode CE in the illustrated embodiments with reference to FIGS. 11 and 12 are included in the second substrate 120, exemplary embodiments are not limited thereto. For example, insulated from the first electrode PE, the second electrode CE may be included in the first substrate 110. In this case, at least one of the first electrode PE and the second electrode CE may be formed in a shape having a plurality of slits.

As is known in the art, the liquid crystal layer LC may adjust light transmittance depending on an electric field formed by the first electrode PE and the second electrode CE. For instance, the liquid crystal molecules of the liquid crystal layer LC may be arranged in a certain direction by the electric field formed by the first electrode PE and the second electrode CE, whereby the light transmittance may be adjusted. In this way, the liquid crystal layer LC may selectively pass light so that the display device displays an image. The light which is supplied to the liquid crystal layer LC may be provided from the external device, e.g., a backlight unit (not shown).

As described above, the display device may supply an image signal to the first electrode PE through the pressure sensing cell PSC so as to display an image. In addition, the display device may sense, using the pressure sensing cell PSC, the magnitude of pressure applied by a touch and the location of the touch.

Hereinbelow, a different type of display devices from the display devices shown in FIGS. 11 and 12 will be described with reference to FIGS. 13 and 14.

Figure 13:
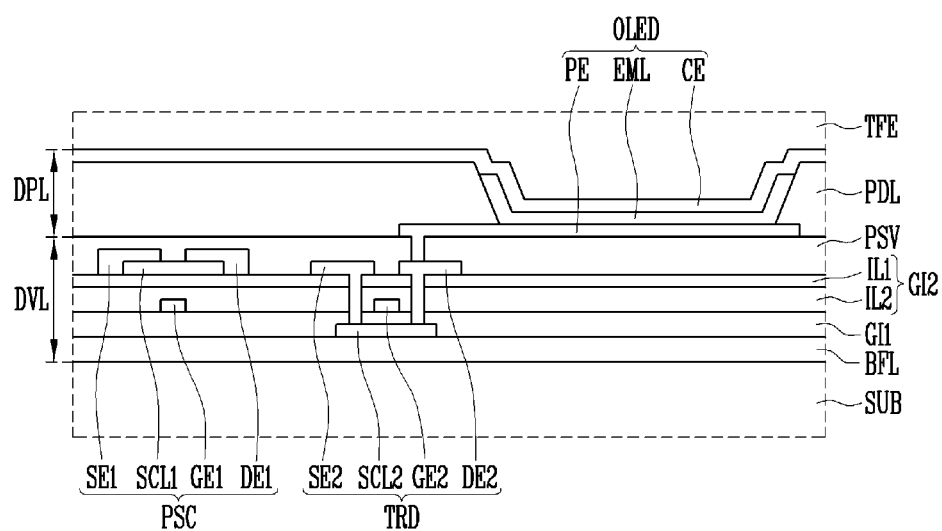
Figure 14:
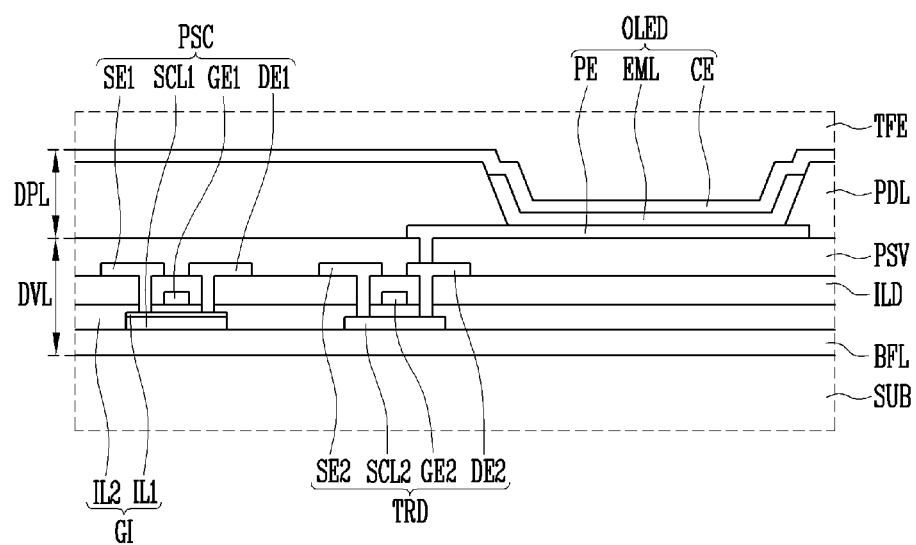

Referring to FIGS. 13 and 14, the display device may be a self-emissive display device. For example, the display device may be an organic light emitting display (OLED).

The display device may include a base substrate SUB, a driving layer DVL disposed on the base substrate SUB, a display layer DPL disposed on the driving layer DVL, and an encapsulation layer TFE disposed on the display layer DPL.

The base substrate SUB may include transparent insulating material to allow light to pass therethrough. The base substrate SUB may be a rigid substrate. The base substrate SUB may be a flexible substrate.

A buffer layer BFL may be further disposed between the base substrate SUB and the driving layer DVL. The buffer layer BFL may include at least one of an organic insulating layer and an inorganic insulating layer.

The driving layer DVL may be disposed on the buffer layer BFL. The driving layer DVL may include a pressure sensing cell PSC, a driving transistor TRD and a protective layer PSV which covers the pressure sensing cell PSC and the driving transistor TRD. The pressure sensing cell PSC may be a switching transistor coupled to the driving transistor TRD, and may control the current of the driving transistor TRD. The pressure sensing cell PSC may include a first gate electrode GE1, a first semiconductor layer SCL1, a first source electrode SE1 and a first drain electrode DE1. The driving transistor TRD may include a second gate electrode GE2, a second semiconductor layer SCL2, a second source electrode SE2, and a second drain electrode DE2.

The pressure sensing cell PSC and the driving transistor TRD may be implemented in various ways or types. For example, as shown in FIG. 13, the pressure sensing cell PSC may be one in which the first gate electrode GE1 is disposed below the first semiconductor layer SCL1, and the driving transistor TRD may be one in which the second gate electrode GE2 is disposed over the second semiconductor layer SCL2.

Hereinafter, the driving layer DVL of the display device shown in FIG. 13 will be described in more detail.

The second semiconductor layer SCL2 may be disposed on the buffer layer BFL. The second semiconductor layer SCL2 may include any one of amorphous silicon (a-Si) and poly crystalline silicon (p-Si).

A first gate insulating layer GI1 which covers the second semiconductor layer SCL2 may be disposed on the buffer layer BFL and the second semiconductor layer SCL2 The first gate insulating layer GI1 may insulate the second semiconductor layer SCL2 from the second gate electrode GE2. The first gate insulating layer GI1 may include at least one of an organic insulating layer and an inorganic insulating layer in the same manner as that of the buffer layer BFL.

The first gate electrode GE1 and the second gate electrode GE2 may be disposed on the first gate insulating layer GI1. The second gate electrode GE2 may at least partially overlap the second semiconductor layer SCL2. The first gate electrode GE1 and the second gate electrode GE2 may include conductive material.

A second gate insulating layer GI2 may be disposed on the first gate electrode GE1, the second gate electrode GE2 and the first gate insulating layer GI1. The second gate insulating layer GI2 may include a second insulating layer IL2 which covers the first gate electrode GE1 and the second gate electrode GE2, and a first insulating layer IL1 which is disposed on the second insulating layer IL2. The first insulating layer IL1 may include oxide or nitride having insulating properties. For example, the first insulating layer IL1 may include aluminum oxide (AlOx). The second insulating layer IL2 may include silicone resin. For example, the second insulating layer IL2 may include at least one of polydimethylsiloxane and polysiloxane. Therefore, the first insulating layer IL1 may prevent or reduce the ability of substances included in the second insulating layer IL2 from diffusing and permeating into the first semiconductor layer SCL1, whereby electrical characteristics of the pressure sensing cell PSC may be prevented from being deteriorated.

The first semiconductor layer SCL1, the first source electrode SE1, the first drain electrode DE1, the second source electrode SE2 and the second drain electrode DE2 may be disposed on the second gate insulating layer GI2.

The first semiconductor layer SCL1 may include any one of oxide semiconductor material, organic semiconductor material, semiconductor material including carbon, and a semiconductor nanowire. The first source electrode SE1 and the first drain electrode DE1 may be disposed at positions spaced apart from each other, and be coupled to the first semiconductor layer SCL1. A channel area of the first semiconductor layer SCL1 may overlap the first gate electrode GE1. The second source electrode SE2 and the second drain electrode DE2 may be disposed at positions spaced apart from each other, and be coupled to the second semiconductor layer SCL2 through respective contact holes.

As shown in FIG. 14, the pressure sensing cell PSC may be one in which the first gate electrode GE1 is disposed over the first semiconductor layer SCL1, and the driving transistor TRD may be one in which the second gate electrode GE2 is disposed over the second semiconductor layer SCL2.

Hereinafter, the driving layer DVL of the display device shown in FIG. 14 will be described in more detail.

The first semiconductor layer SCL1 and the second semiconductor layer SCL2 may be disposed on the buffer layer BFL.

A gate insulating layer GI which covers the first semiconductor layer SCL1 and the second semiconductor layer SCL2 may be disposed on the base substrate SUB (or the buffer layer BFL), the first semiconductor layer SCL1, and the second semiconductor layer SCL2.

The gate insulating layer GI may include a first insulating layer IL1 disposed on a surface of the first semiconductor layer SCL1, and a second insulating layer IL2 disposed on the base substrate SUB, the second semiconductor layer SCL2 and the first insulating layer ILL The first gate electrode GE1 and the second gate electrode GE2 may be disposed on the first gate insulating layer GI. The first gate electrode GE1 may at least partially overlap the first semiconductor layer SCL1. The second gate electrode GE2 may at least partially overlap the second semiconductor layer SCL2.

An interlayer insulating layer ILD may be disposed on the gate insulating layer GI, the first gate electrode GE1 and the second gate electrode GE2. The interlayer insulating layer ILD may cover the first gate electrode GE1 and the second gate electrode GE2. The interlayer insulating layer ILD may include at least one of an organic insulating layer and an inorganic insulating layer.

The first source electrode SE1, the first drain electrode DE1, the second source electrode SE2 and the second drain electrode DE2 may be disposed on the interlayer insulating layer IDL.

The first source electrode SE1 and the first drain electrode DE1 may be disposed at positions spaced apart from each other, and be coupled to the first semiconductor layer SCL1. The second source electrode SE2 and the second drain electrode DE2 may be disposed at positions spaced apart from each other, and be coupled to the second semiconductor layer SCL2 through respective contact holes.

The pressure sensing cell PSC and the driving transistor TRD may be covered with a protective layer PSV. The protective layer PSV may expose a portion of the second drain electrode DE2. The protective layer PSV may include at least one layer. For example, the protective layer PSV may include at least one of an inorganic protective layer and an organic protective layer.

The display layer DPL may be disposed on the protective layer PSV. The display layer DPL may include a display element OLED coupled to the second drain electrode DE2.

The display element OLED may include a first electrode PE coupled to the second drain electrode DE2, a light-emitting layer EML disposed on the first electrode PE, and a second electrode CE disposed on the light-emitting layer EML.

Any one of the first electrode PE and the second electrode CE may be an anode electrode, and the other may be a cathode electrode. For example, the first electrode PE may be an anode electrode, and the second electrode CE may be a cathode electrode.

Furthermore, at least one of the first electrode PE and the second electrode CE may be a transmissive electrode. For example, in the case where the display element OLED is a bottom emitting type organic light-emitting diode, the first electrode PE may be a transmissive electrode, and the second electrode CE may be a reflective electrode. In the case where the display element OLED is a top emitting type organic light-emitting diode, the first electrode PE may be a reflective electrode, and the second electrode CE may be a transmissive electrode. In the case where the display element OLED is a both-side emitting type organic light-emitting diode, both the first electrode PE and the second electrode CE may be transmissive electrodes.

For descriptive convenience, an exemplary case where the first electrode PE is an anode electrode and the display element OLED is a top emitting type organic light-emitting element will be described.

The first electrode PE may be disposed on the protective layer PSV. The first electrode PE may include a reflective layer which reflects light, and a transparent conductive layer which is disposed on or under the reflective layer. At least one of the reflective layer and the transparent conductive layer may be coupled to the drain electrode DE.

The reflective layer may include material that is able to reflect light. For example, the reflective layer may include at least one of aluminum (Al), silver (Ag), chrome (Cr), molybdenum (Mo), platinum (Pt), nickel (Ni) and an alloy of them.

The transparent conductive layer may include transparent conductive oxide. For example, the transparent conductive layer may include at least one transparent conductive oxide of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL may be disposed on the first electrode PE and the protective layer PSV. The pixel defining layer PDL may expose a portion of the first electrode PE. For example, the pixel defining layer PDL may have a shape covering an edge of the first electrode PE.

The pixel defining layer PDL may include organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy resin, benzocyclobutene (BCB), siloxane based resin, and silane based resin.

The light-emitting layer EML may be disposed on the exposed surface of the first electrode PE. The light-emitting layer EML may have a multi-layered thin-film structure including at least a light generation layer (LGL). For instance, the light-emitting layer EML may include: a hole injection layer (HIL) into which holes are injected; a hole transport layer (HTL) which has excellent hole transportation performance and restrains movement of electrons that have not been recombined with holes in the light generation layer and thus increases chances of recombination between holes and electrons; the light generation layer which emits light by recombination between injected electrons and holes; a hole blocking layer (HBL) which restrains movement of holes that have not been recombined with electrons in the light generation layer; an electron transport layer (ETL) which is provided to smoothly transport electrons to the light generation layer; and an electron injection layer (EIL) into which electrons are injected. The hole injection layer, the hole transport layer, the hole blocking layer, the electron transport layer, and the electron injection layer of the light-emitting layer EML may be common layers which are provided in common in adjacent pixels.

The color of light generated from the light generation layer may be one of red, green, blue and white, but exemplary embodiments are not limited thereto. For example, the color of light generated from the light generation layer may be one of magenta, cyan and yellow.

The second electrode CE may be disposed on the light-emitting layer EML. The second electrode CE may be a semi-transmissive reflective layer. For example, the second electrode CE may be a thin metal layer having a thickness allowing light to pass therethrough. The second electrode CE may allow some of the light generated from the light-emitting layer EML to pass therethrough and may reflect the rest of the light generated from the light-emitting layer EML. The light reflected by the second electrode CE may be reflected by the reflective layer of the first electrode PE and then pass through the second electrode CE by the constructive interference.

The second electrode CE may include material having a work function lower than that of the transparent conductive layer of the first electrode PE. For instance, the second electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy of them.

The encapsulation layer TFE may be disposed on the second electrode CE. The encapsulation layer TFE may isolate the display element OLED from external environments. For example, the encapsulation layer TFE may prevent external moisture and oxygen from permeating into the display element OLED. The encapsulation layer TFE may be a thin-film encapsulation layer including a plurality of inorganic layers and a plurality of organic layers which are disposed on the second electrode CE. For example, the encapsulation layer TFE may have a structure in which the inorganic layer and the organic layer are alternately stacked.

The component used to isolate the display element OLED from external environments may be variously changed. For example, to isolate the display element OLED from external environments, an encapsulation substrate may be used in lieu of the encapsulation layer TFE. The encapsulation substrate may adhere to the base substrate SUB using sealant. In the case where the display element OLED is isolated from external environments using the encapsulation substrate, the encapsulation layer TFE may be omitted.

As described above, the display device may display an image by supplying an image signal to the first electrode PE through the pressure sensing cell PSC and the driving transistor TRD. In addition, the display device may sense the magnitude of pressure applied by a touch and the location of the touch using the pressure sensing cell PSC.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A pressure sensor comprising:
   a semiconductor layer;
   a gate electrode configured to overlap the semiconductor layer;
   a gate insulating layer disposed between the semiconductor layer and the gate electrode and including a first insulating layer disposed on a surface of the semiconductor layer that faces the gate electrode and a second insulating layer disposed at least between the first insulating layer and the gate electrode, the second insulating layer comprising silicone resin having elasticity; and
   a source electrode and a drain electrode respectively coupled to spaced portions of the semiconductor layer,
   wherein the first insulating layer comprises an aluminum oxide and is disposed between the surface of the semiconductor layer and the second insulating layer to limit material in the second insulating layer from diffusing into the semiconductor layer.

2. The pressure sensor of claim 1, wherein the second insulating layer comprises at least one of polydimethylsiloxane and polysiloxane.

3. The pressure sensor of claim 1, wherein the semiconductor layer comprises any one of oxide semiconductor material, organic semiconductor material, semiconductor material including carbon, and a semiconductor nanowire.

4. The pressure sensor of claim 1, wherein:
   the source electrode and the drain electrode are disposed on a base substrate at positions spaced apart from each other; and
   the spaced portions of the semiconductor layer are disposed on the source electrode and the drain electrode, respectively.

5. The pressure sensor of claim 4, wherein:
   the second insulating layer covers the first insulating layer, the source electrode, and the drain electrode.

6. A display device comprising:
   a first substrate including a pressure sensing cell and a first electrode coupled to the pressure sensing cell;
   a second substrate configured to face the first substrate and including a second electrode; and
   a liquid crystal layer disposed between the first substrate and the second substrate,
   wherein the pressure sensing cell comprises:
      a semiconductor layer disposed on a base substrate;
      a gate electrode configured to overlap the semiconductor layer;
      a gate insulating layer disposed between the semiconductor layer and the gate electrode and including a first insulating layer disposed on a surface of the semiconductor layer that faces the gate electrode and a second insulating layer disposed at least between the first insulating layer and the gate electrode, the second insulating layer comprising silicone resin having elasticity; and
      a source electrode and a drain electrode respectively coupled to spaced portions of the semiconductor layer, and
   wherein the first insulating layer comprises an aluminum oxide and is disposed between the surface of the semiconductor layer and the second insulating layer to limit material in the second insulating layer from diffusing into the semiconductor layer.

7. The display device of claim 6, wherein the second insulating layer comprises at least one of polydimethylsiloxane and polysiloxane.

8. The display device of claim 6, wherein the semiconductor layer comprises any one of oxide semiconductor material, organic semiconductor material, semiconductor material including carbon, and a semiconductor nanowire.

9. The display device of claim 6, further comprising a buffer layer disposed between the semiconductor layer and the base substrate.

10. A display device comprising:
   a base substrate;
   a driving layer disposed on the base substrate and including a pressure sensing cell and a driving transistor coupled to the pressure sensing cell, wherein current in the driving transistor is controlled by the pressure sensing cell; and
   a display element including a first electrode coupled to the driving transistor, a light-emitting layer disposed on the first electrode and a second electrode disposed on the light-emitting layer,
   wherein the pressure sensing cell comprises:
      a semiconductor layer disposed on the base substrate;
      a gate electrode configured to overlap the semiconductor layer;
      a gate insulating layer disposed between the semiconductor layer and the gate electrode and including a first insulating layer disposed on a surface of the semiconductor layer that faces the gate electrode and a second insulating layer disposed at least between the first insulating layer and the gate electrode, the second insulating layer comprising silicone resin having elasticity; and
      a source electrode and a drain electrode respectively coupled to spaced portions of the semiconductor layer, and
   wherein the first insulating layer comprises an aluminum oxide and is disposed between the surface of the semiconductor layer and the second insulating layer to limit material in the second insulating layer from diffusing into the semiconductor layer.

11. The display device of claim 10, wherein the second insulating layer comprises at least one of polydimethylsiloxane and polysiloxane.

12. The display device of claim 10, wherein the semiconductor layer comprises any one of oxide semiconductor material, organic semiconductor material, semiconductor material including carbon, and a semiconductor nanowire.

* * * * *

UNITED STATES PATENT AND TRADEMARK OFFICE
CERTIFICATE OF CORRECTION

PATENT NO. : 10,573,761 B2  
APPLICATION NO. : 15/852906  
DATED : February 25, 2020  
INVENTOR(S) : Jae Ik Lim et al.

Page 1 of 1

It is certified that error appears in the above-identified patent and that said Letters Patent is hereby corrected as shown below:

On the Title Page

Item (72), 6th Inventor should read:
"Sangyoon Ji".

Signed and Sealed this
Second Day of June, 2020

Andrei Iancu
*Director of the United States Patent and Trademark Office*